United States Patent [19]
Shun'ko

[11] Patent Number: 5,998,933
[45] Date of Patent: Dec. 7, 1999

[54] RF PLASMA INDUCTOR WITH CLOSED FERRITE CORE

[76] Inventor: Evgeny V. Shun'ko, 735 Loretta St., Pittsburgh, Pa. 15217

[21] Appl. No.: 09/055,452

[22] Filed: Apr. 6, 1998

[51] Int. Cl.$^6$ .................................................. H05H 1/46
[52] U.S. Cl. ............................. 315/111.51; 313/231.31; 118/723 I; 156/345
[58] Field of Search .................... 315/111.21, 111.41, 315/111.51; 313/231.31; 118/723 AN, 723 I, 723 IR; 156/345 C

[56] References Cited

U.S. PATENT DOCUMENTS

| | | | |
|---|---|---|---|
| 5,290,382 | 3/1994 | Zarowin et al. | 315/111.21 X |
| 5,464,476 | 11/1995 | Gibb et al. | 156/345 C X |
| 5,560,776 | 10/1996 | Sugai et al. | 118/723 AN |
| 5,591,493 | 1/1997 | Paranjpe et al. | 315/111.51 X |
| 5,619,103 | 4/1997 | Tobin et al. | 315/111.21 |

FOREIGN PATENT DOCUMENTS

| | | | |
|---|---|---|---|
| 2-260399 | 10/1990 | Japan | 315/111.51 |
| 5-144594 | 6/1993 | Japan | 315/111.51 |
| 5-166595 | 7/1993 | Japan | 315/111.51 |

*Primary Examiner*—Justin P. Bettendorf
*Attorney, Agent, or Firm*—Carothers & Carothers

[57] ABSTRACT

The present invention pertains to RF (radio frequency) inductive coupling plasma (ICP) inductors having an actual primary winding (powered directly by an RF source) wound around a closed ferrite core, and a virtual closed secondary winding formed around this ferrite core in a plasma contained within a discharge chamber. The present invention enables one to maintain a uniform plasma with no limitation in process sizes and assumes a variety of embodiments. The simplest is merely an annular ferrite core having a primary winding (a few turns) which is placed into the discharge chamber filled with a necessary gas. The plasma sources based on the present invention can be applied in plasma processing technology: etching, deposition, ion implantation, abatement, etc. in plasma devices from ten Watts to a few kW, at an operating frequency from 100 kHz to a few MHZ, and at linear sizes from a few centimeters to a few meters.

7 Claims, 8 Drawing Sheets

RF PLASMA INDUCTOR WITH CLOSED FERRITE CORE

The present invention is related to a RF (radio frequency) inductor of plasma for a plasma processing technology. More specifically, the present invention is related to a plasma inductor having a closed ferrite core with an actual primary winding supplied directly by RF power, and a virtual secondary closed winding formed by gas-discharge plasma in a discharge chamber with controllable gas pressure.

BACKGROUND OF THE INVENTION

RF plasma sources are widely used in plasma processing technology for large scale manufacturing of semiconductor chips (etching, deposition, ion implantation, sputtering), large panel displays, and ion sources. Inductively coupled plasma (ICP) sources as well as microwave plasma (MWP) sources have been more popular in a new generation of plasma reactors due to their ability to maintain high-density plasma at very low gas pressure, and due to their capability to separate a process of plasma generation from an ion acceleration.

One of the most advanced dense-plasma sources based on an inductive RF discharge (ICP) is shown in FIG. 2. This typical ICP source comprises a flat helix inductor coil 4 and a metallic discharge chamber 1 (filed with operating gas) having a quartz window 8 which separates a discharge volume of the chamber 1 from the inductor coil 4 thereby maintaining a plasma within the chamber. The direction of the electric field induced by the coil 4 is shown as a circular arrow in FIG. 2. The base 6 of the chamber contains either plasma processed substrate or an ion extracting arrangement for creating an ion beam. The external RF power source 5, connected to the inductor coil 4 via a matching device (matcher) 7, maintains the RF current in the inductor coil 4. This RF current induces an azimuthal RF electric field which maintains an azimuthal RF discharge current producing a plasma. The same configuration enables one to consider the ICP inductor as an electrical transformer where the inductor coil 4 is an actual primary winding and the plasma is a single closed turn of a virtual secondary winding. The matcher 7 is an essential part of the ICP inductor. It performs two important functions. First of them is to match the 50 Ohm conventional output resistance of the RF power source 5 with the inductor coil 4 impedance (depending on plasma parameters) for efficient power transfer to an ICP inductor. The second one is to tune the inductor coil 4 circuit to a resonance with an operating frequency, thereby, to enhance resonantly the RF current in the coil 4.

For a typical ICP inductor driven at a standard industrial application frequency of 13.56 MHZ, and with the RF power transferred into the plasma being around 1 kW, the inner volume of the discharge chamber 1 is a few liters, and the operating gas pressure is in the range 1–100 mTorr, the resonant RF current of the coil is a few tens of Amperes, and the RF voltage across the inductor coil 4 is a few kV. Under these conditions, the RF power loss in the matcher, connectors, and the inductor coil itself (due to its final resistance) is comparable to that transferred to the plasma. Moreover, due to the coil 4 and the metallic chamber 1 proximity, an essential RF current is induced along the chamber wall. This effect results in an additional power loss because of chamber heating. Therefore, a power transfer efficiency to the plasma is essentially less than 1, since a perceptible power has been dissipated in the ICP source hardware of the practically realized devices.

The large scale of RF voltage across the inductor coil 4 (a few kV) creates a considerable capacitive coupling between the coil and the plasma resulting in a capacitive current through the plasma to the chamber wall, and also in a high dc negative potential on the inner surface of the quartz window 8. The mentioned high dc potential accelerates the plasma ions toward the window causing window surface erosion and plasma contamination. Additionally, the capacitive RF current increases the plasma dc potential reference with respect to the chamber. This effect leads to a limitation (from the bottom) of minimum energy of the ions coming to a substrate 6 and is capable of damaging the substrate. Generally, the presence of high RF voltages on the coil 4 and the matching device 7 causes various serious problems (corona, sparking, breakdown) and costly efforts to prevent them.

The present invention enables one to overcome all the considered problems by insertion of a closed core with a high permeability (ferrite core) into an actual primary winding (inductor coil) and into a virtual secondary winding (induced plasma), instead of an air-core used for the conventional ICP inductor shown in FIG. 2.

SUMMARY OF THE INVENTION

The present invention pertains to an inductive coupling plasma (ICP) inductor 2 (see FIG. 1) comprising a ferromagnetic closed core 3 with a few turns of a primary winding 4 thereon connected directly to RF power source 5. For plasma generation, the mentioned inductor 2 has been placed into a discharge chamber 1 filed with an operating gas and having at its bottom a base 6 arranged either with a processed substrate or with a system for ion extraction. A plasma generated by inductor 2 forms around the core 3, a virtual secondary closed winding having approximately a toroidal shape in the case presented in FIG. 1. The direction of the RF electric field and current in the plasma is shown by curved arrows in the cross section presented in FIG. 1.

Application of the closed ferromagnetic core 3 with a high magnetic permeability enables one to significantly reduce the RF frequency required for plasma generation and also to increase power transfer efficiency from the RF power source to the plasma. This effect has the same character as has been the case with a conventional electric transformer wherein the use of a core with a high magnetic permeability drastically enhanced transformer performance, allowing an efficient transformer operation at a perceptibly lower frequency. Applying a lower frequency (400 kHz instead of 13.56 MHZ) reduces dramatically the cost of the RF power source, increases its efficiency, and eliminates the necessity of a resonance matching device ( 7 in FIG. 2) with its expensive variable vacuum capacitors as well as a cooling system. Operation at a reduced frequency with a closed ferromagnetic core enables one to obtain better coupling at a lower power loss (comprised of a loss in the core and in the winding) in the inductor. Additionally, a discharge current path closed around the inductor core in the present invention is shorter than that in the conventional type of ICP source at the same volume of generated plasma due to features of the closed core geometry, as can be seen from a comparison of the devices presented in FIGS. 1 and 2. Therefore, the discharge voltage (which is nearly proportional to the length of the discharge path) is smaller in the present invention than that in the conventional type of ICP source shown in FIG. 2. This advantage of the present invention has practically eliminated the rectification effect occurring due to capacitive coupling of the primary winding with the plasma and, consequently, has decreased the dc potential of the plasma generated by the present invention to a floating potential equal to a few electron temperatures expressed in eV. Actually, the RF voltage acquired by a plasma capacitance near the quartz window 8, FIG. 2, in the conventional type of ICP source is considerably higher than an operating RF voltage on plasma along the azimuthal discharge path shown as a curved arrow in FIG. 2.

The present invention having enhanced magnetic coupling (due to a closed ferromagnetic core) is similar to an ideal electric transformer with a coupling coefficient close to 1. Indeed, at a low frequency, a plasma reactance originated by an electron inertia is negligibly small compared to its electric resistance. This results in two consequences: the first one is the reduced discharge RF electric field and the voltage as well, and the second one is that a plasma load transformed to the primary winding 4, FIG. 1, is acquired by the RF power source 5 as the resistive one. Therefore, there is no necessity for compensation of the reactance originated by the plasma and by primary winding leakage inductance typical for a high frequency operation with a loose coupling (air core) in the conventional ICP source. In the present invention, the matching is easily achieved without any an additional resonant matcher by merely choosing a proper number of turns for the primary winding 4, FIG. 1, or tapping it.

Due to good coupling between the plasma and the primary winding 4, FIG. 1, the primary voltage is defined as the discharge voltage taken along one closed round of the core path-turn and multiplied by the number of the primary winding turns. It is just tens or hundreds of volts (depending on plasma parameters and geometrical characteristics of the inductor) in comparison with several kV necessary for the conventional ICP inductor shown in FIG. 2. This fact results in simplicity of the wire lead and winding insulation, in a significant decrease in a power loss, and consequently in an increase of the reliability of the apparatus of the present invention.

BRIEF DESCRIPTION OF THE DRAWINGS

In the accompanying drawings, the preferred embodiments of the invention are illustrated in which.

DESCRIPTION OF PREFERRED EMBODIMENTS

Figure 1:
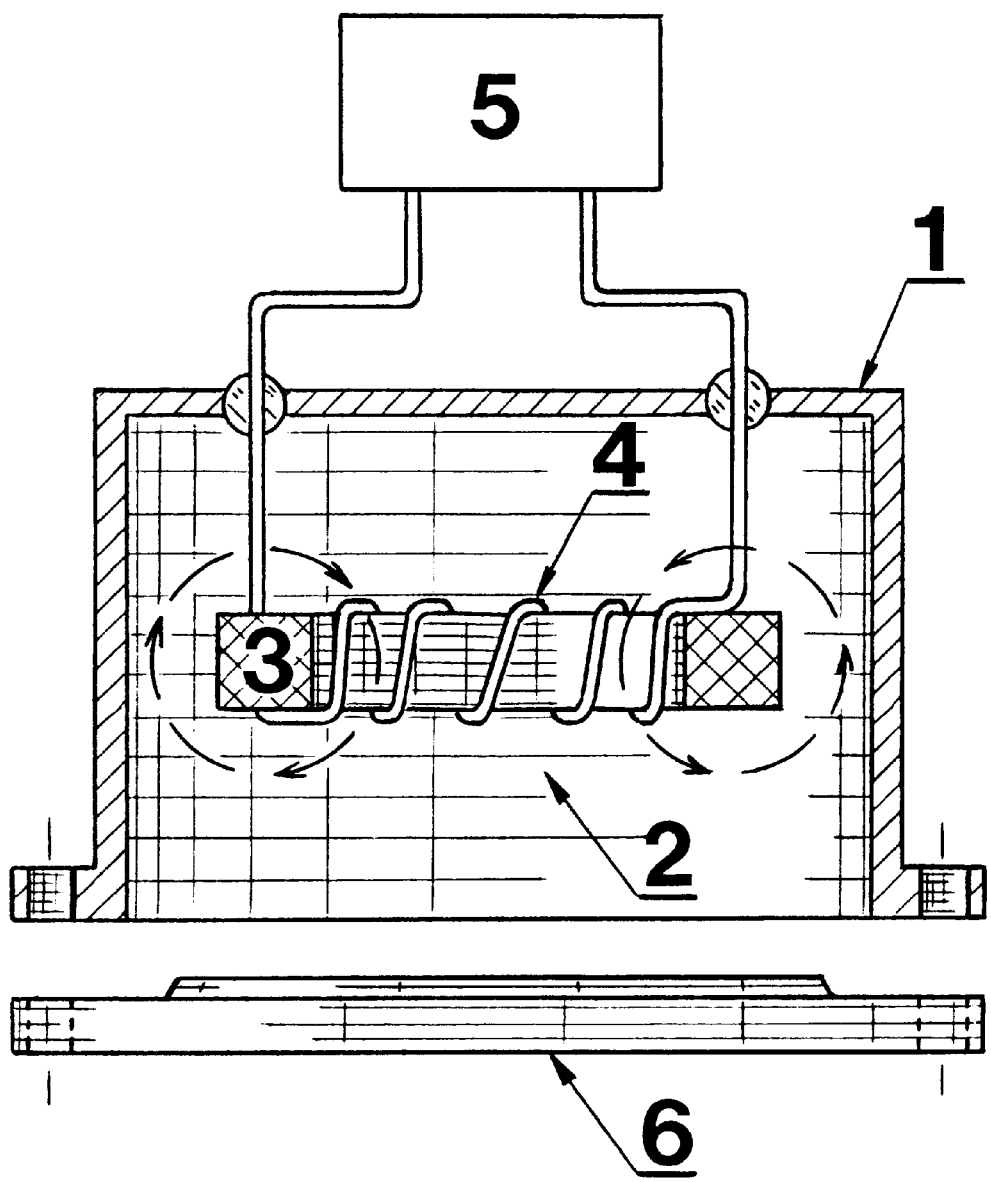
FIG. 1 is a schematic representation showing a plasma inductor placed in a gas discharge chamber in accordance with the teachings of the present invention.
Figure 2:
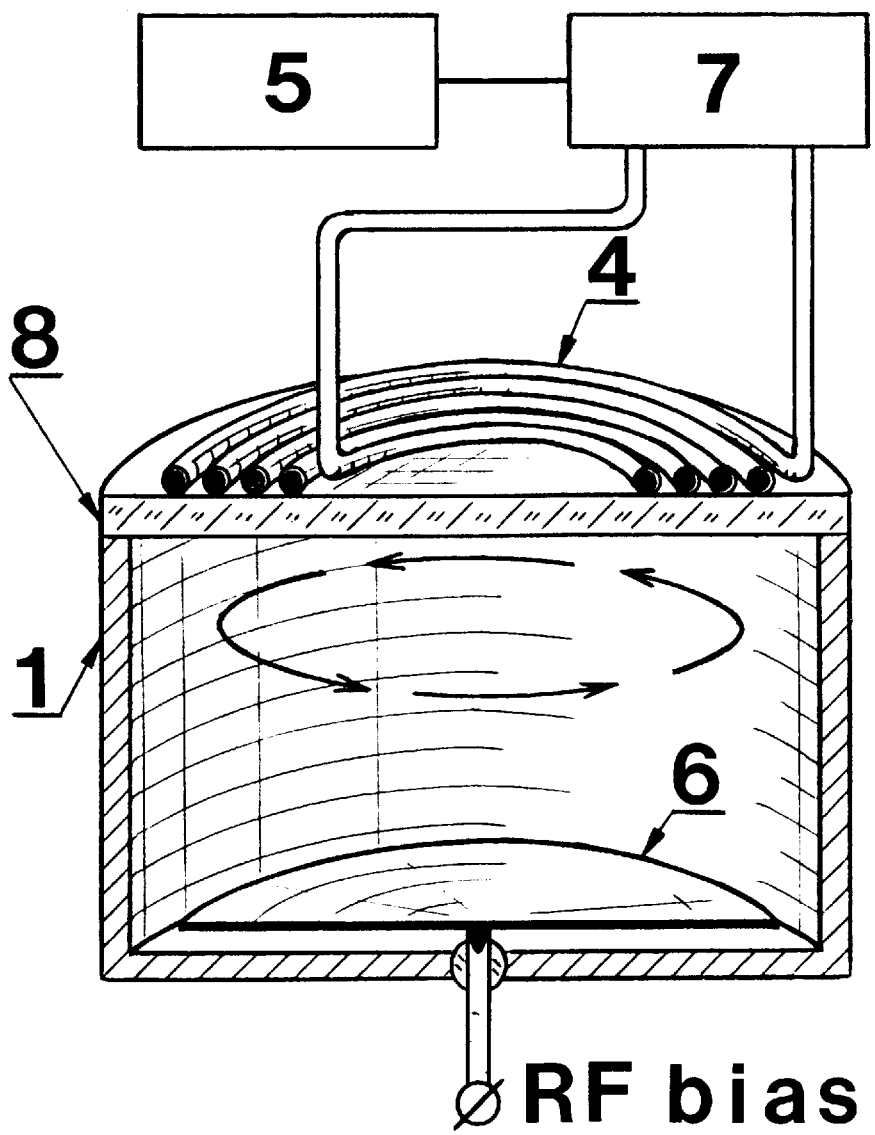
FIG. 2 is a schematic representation showing a typical prior art plasma inductor together with a discharge chamber.
Figure 3:
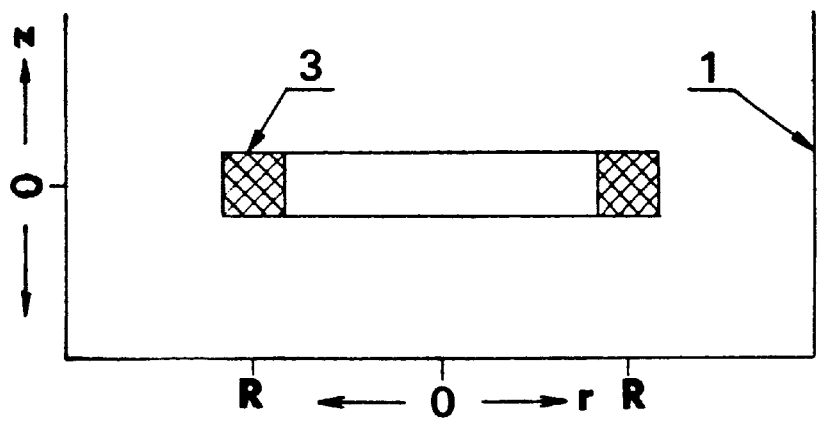
FIGS. 3(*a*), (*b*), and (*c*) are qualitative graphical representations of electrical parameters characterizing plasma produced by the plasma inductor shown in FIGS. 1 and 4: graph (a) is the system of axial, z, and radial, r, coordinates referring to the core 3 of the inductor and to the wall 1 of the discharge chamber; graph (b) is the electric field E (solid line) and electric current density J (dashed line) radial distributions in the plasma at axial distance z≈0; graph (c) is the plasma density $n_p$ radial distribution at various axial distances z.
Figure 3:
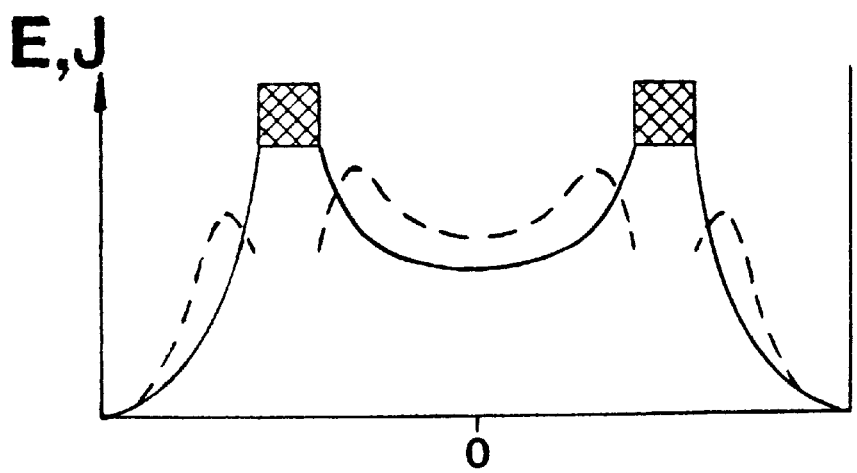
Figure 3:
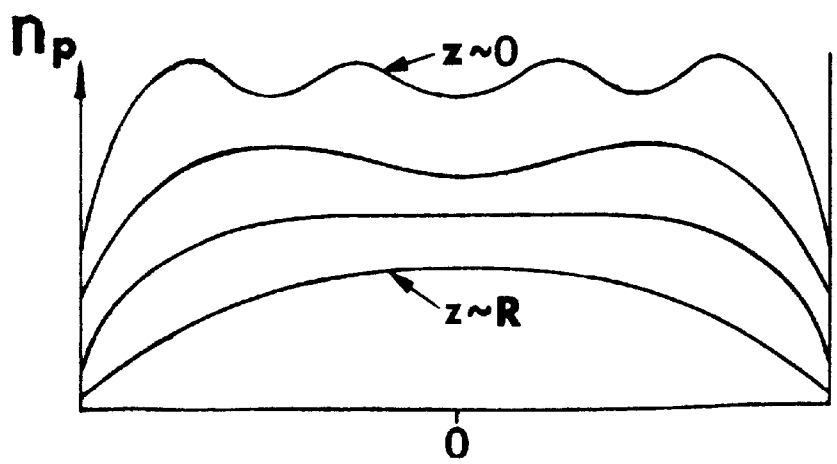
Figure 4:
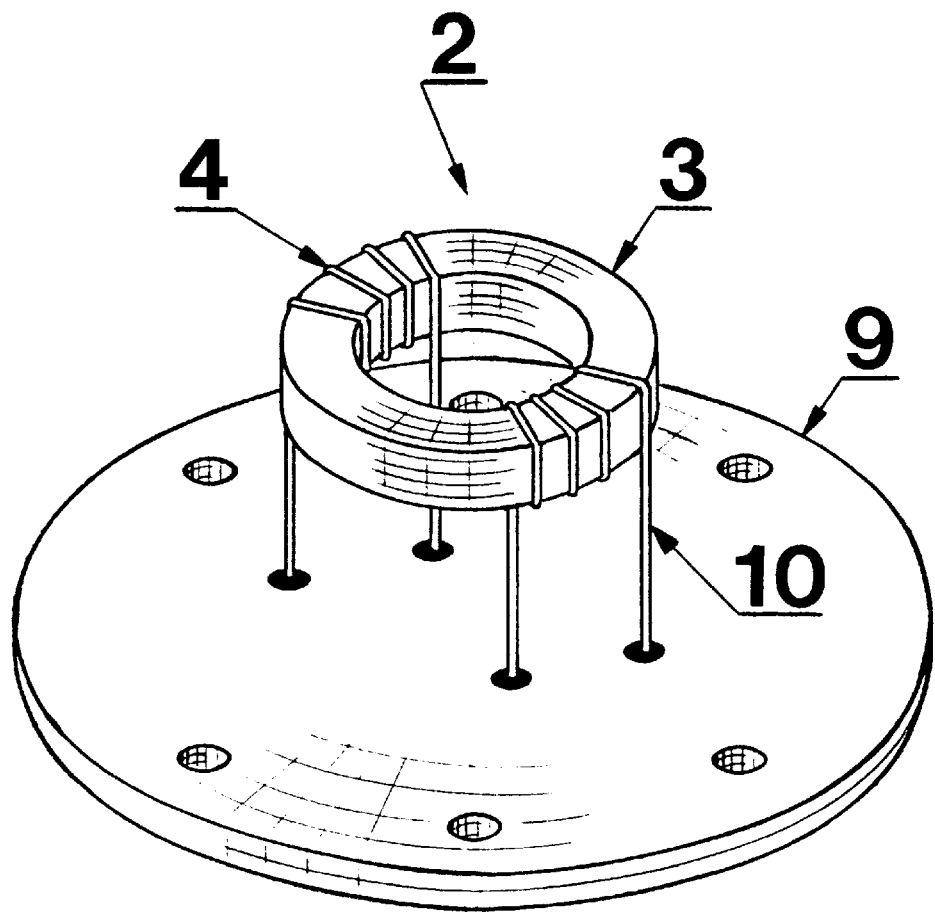
FIG. 4 is a schematic representation of a plasma inductor of the present invention with a subdivided primary winding mechanically mounted with the base by lead wires.

Two conditions must be performed for a proper application of the plasma inductor with the closed core of high permeability. First is the absence of closed turns around the core of metallic hardware mounting the inductor to a discharge chamber. And the second is an existence of free space around the core and inside the discharge chamber for proper formation of a virtual secondary closed winding in a plasma maintained by the inductor. Taking into account these conditions, a variety of inductor embodiments can be considered. The most plain is shown in FIG. 4. Here, the inductor 2 is comprised of the closed annular ferrite core 3, the subdivided primary winding 4 with leading bare-wires 10 providing a mechanical mounting for the inductor 2 with the base 9 by the standoff tube insulators (which are not shown in FIG. 4), and the virtual secondary closed winding of the plasma having the shape of a toroid surrounding the ferrite core 3, see also FIG. 1. In FIG. 3(*b*) is shown a radial distribution of the electric field strength magnitude E (solid line) and the density of the electric current magnitude J (dashed line) corresponding to the inductor shown in FIGS. 1 and 4. The radial distribution of the plasma density at different axial distances z from the inductor is shown in FIG. 3(*c*). To prevent the winding from shunting, the ferrite material should be of a low electrical conductivity; otherwise, the use of a non-organic insulation (fiberglass, quartz, etc.) is necessary. This, the simplest embodiment, has a certain limitation for overall power deposited to the discharge plasma since a ferrite core temperature at high power could reach the Quiri temperature (150–500° C.) at which the ferrite core loses its permeability.

Figure 5:
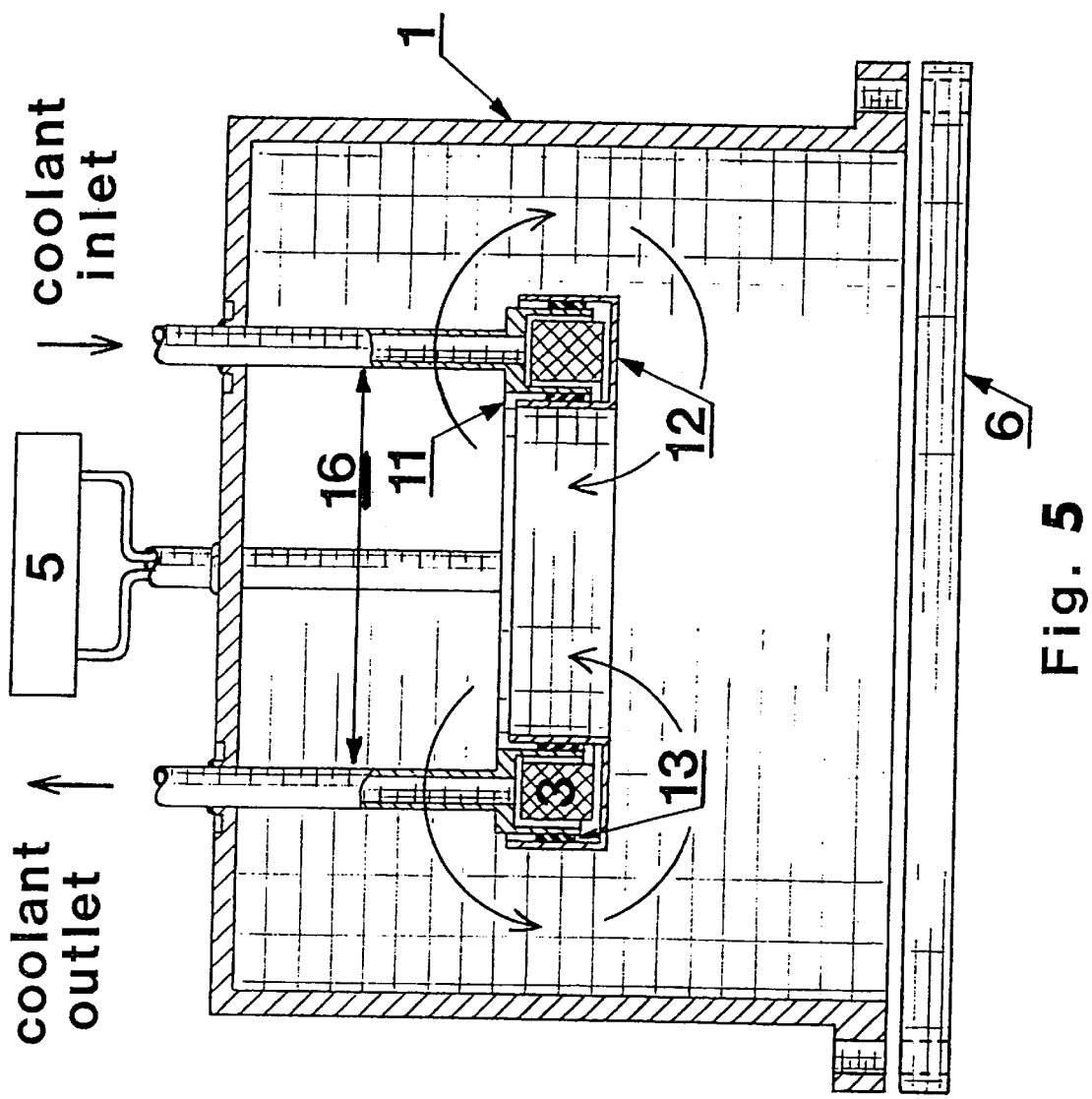
FIG. 5 is a schematic representation of a plasma inductor core encapsulated in a metallic jacket providing cooling of the core which is positioned in a discharge chamber illustrating yet another embodiment of the RF plasma inductor of the present invention.

For a high power system, a prescribed cooling of the inductor is necessary to maintain the core temperature. Air or water cooling is used with a capsulated core as is shown in FIG. 5. The capsulation jacket has been provided as a metallic envelope comprised of two electrically disconnected parts 11, 12 to prevent a short circuit around the core 3. An insulating vacuum seal 13 between the envelope parts 11, 12 is provided and arranged with sealing o-rings. The seal should be protected from direct contact with plasma. This is achieved with thin deep pockets, plugged with ceramic or quartz rings, formed along the contours of parts 11 and 12 in conjunction. For the cooling inlet and outlet, two nipples (stainless steel pipes) 16 are welded between the upper envelope part 11 and discharge 1. These nipples provides provide a mechanical mounting for the envelope part 11 within the discharge chamber 1 as well.

Figure 6:
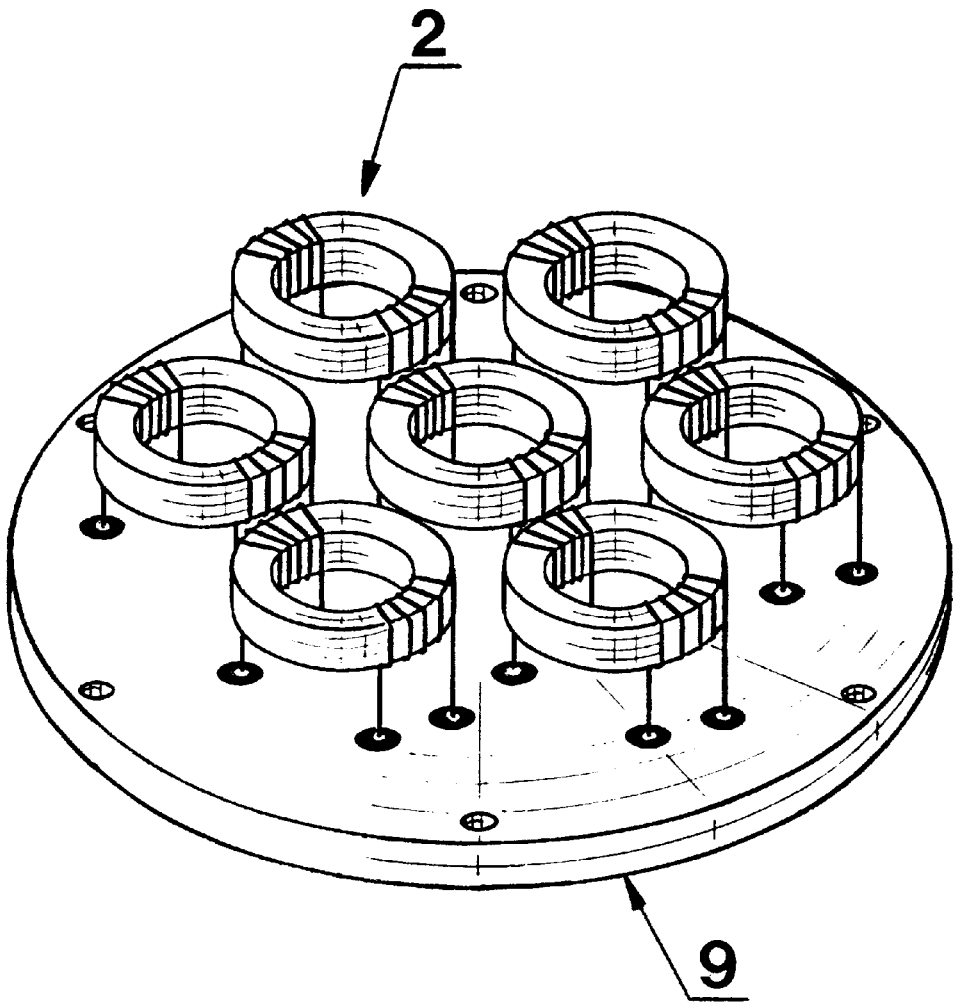
FIG. 6 is a schematic representation of an assembly of the present invention of annular plasma inductors providing a uniform distribution of plasma on a large scale for a processed surface area having a round geometry.
Figure 7:
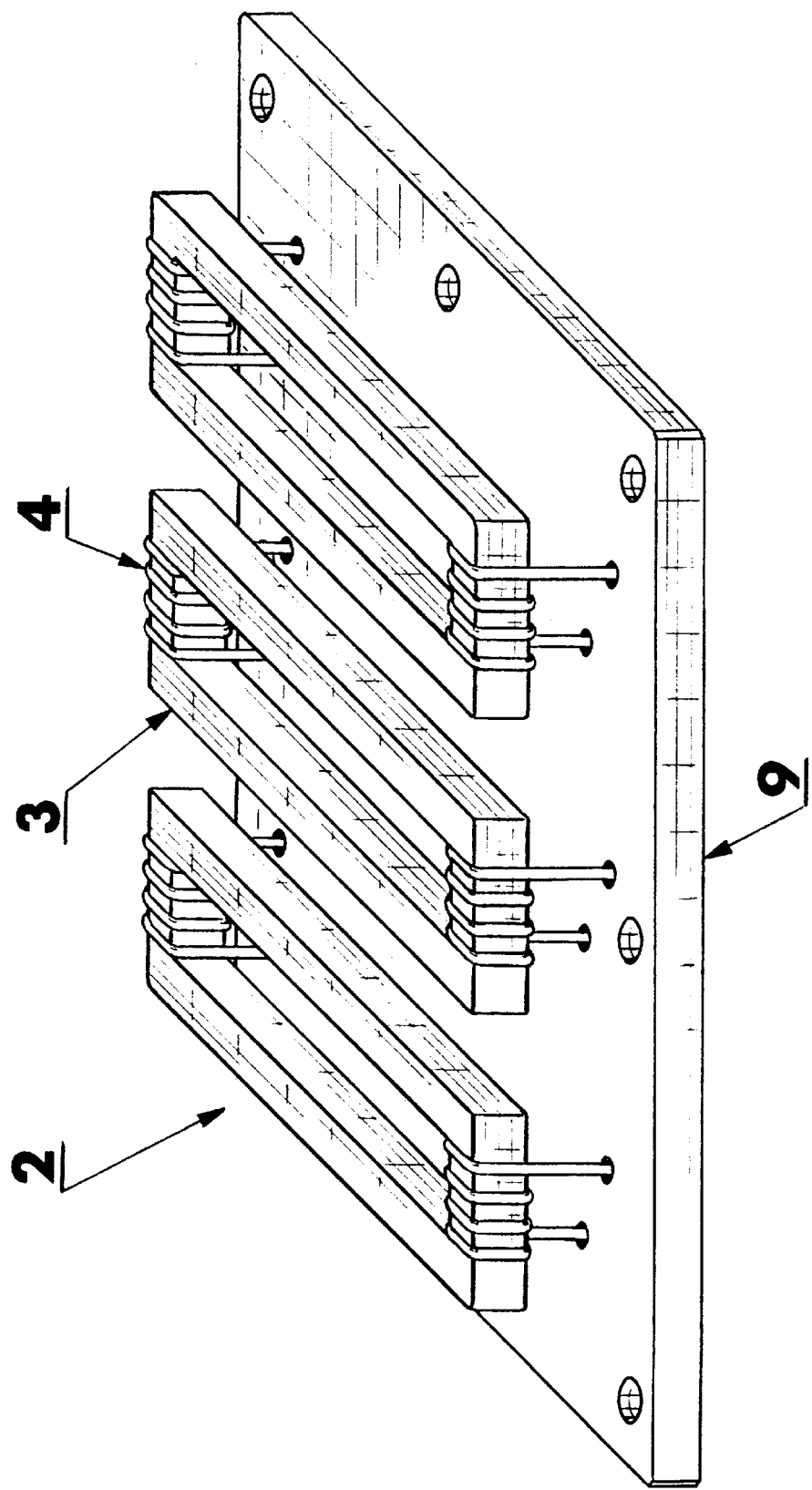
FIG. 7 is a schematic representation of another assembly of the present invention of rectangularly configured plasma inductors providing a uniform distribution of plasma on a large scale of a processed surface area having a rectangular geometry.

A uniform plasma density radial distribution is obtained by the single annular inductor, FIG. 4, at a certain axial distance from the inductor core 3, as is seen in FIG. 3(*c*). This distance depends on the size of discharge chamber 1 and the inductor, as well as on the kind of ionized gas used. However for various practical applications, the uniform distribution of plasma density is only a condition for proper plasma processing. In order to obtain that condition independent of geometrical and physical characteristics of the discharge, whether round or rectangular plasma inductors 2 are mounted on the correspondingly shaped base 9 in the assembly, as shown in FIGS. 6 and 7, the inductors are arranged electrically in a few groups having separate RF power supplies providing effective control of plasma uniformity over the whole discharge chamber. Due to high magnetic permeability, a magnetic flux generated by the primary windings is closed into the ferrite cores almost completely. Therefore, the inductors can be installed at any reasonable distance from one another without interference of their magnetic fields. With multiple inductors, the plasma sources of rectangular or round shape can be built with no size limitations.

Figure 8:
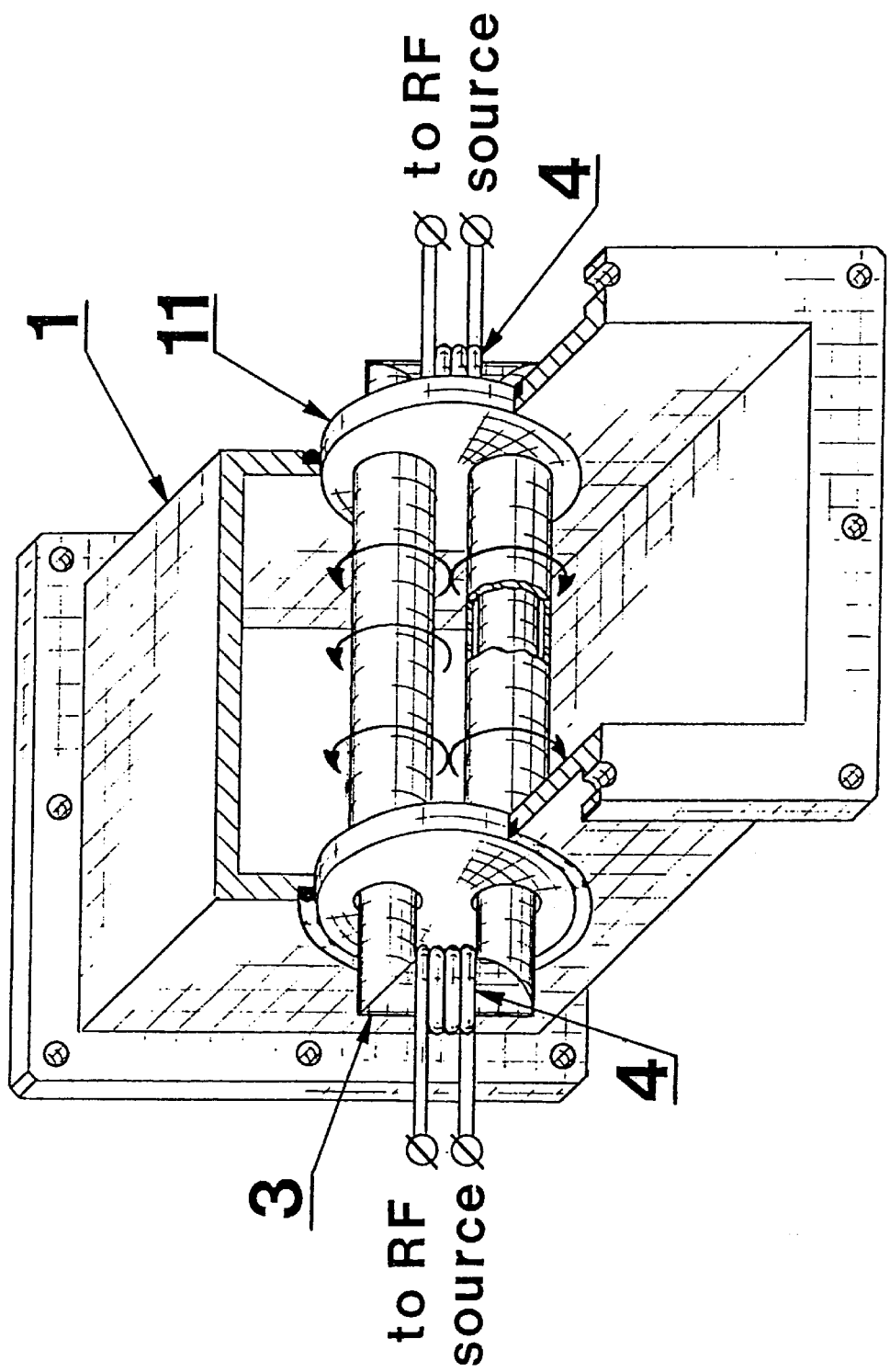
FIG. 8 is a schematic representation of a rectangular configured plasma inductor in an open nonconductive jacket providing a vacuum-sealed separation of the inductor core from an inner volume of a metallic discharge chamber in accordance with yet another embodiment of the present invention.

Another arrangement of the present invention wherein the inductor is removed from the discharge chamber volume is shown in FIG. 8. This inductor is comprised of the rectangularly configured core 3 with the subdivided actual primary winding 4 wound around the short bars of the core, two parallel virtual secondary plasma windings of a cylindrical shape (shown by the curved arrows) closed around long bars of the core, and the open jacket 11 of an insulator (ceramic, quartz) for separation of the core 3 from the volume of discharge chamber 1. The jacket 11 is comprised of two parallel pipes terminated symmetrically by two round flanges common for both pipes at their ends. Thus, the pipes and the flanges form an entire solid body for the jacket 11. The opposite round flanges of the jacket 11 are mounted and sealed into corresponding round holes provided in opposite walls of the discharge chamber 1. It is to be understood that if the discharge chamber 1 has been fabricated of an insulator, the jacket 11 is transformed to two parallel pipes (of the same insulator) crossing the chamber 1 from the opposite walls. The space between inner surfaces of the jacket pipes and the long bars of the core passing through these pipes is used for cooling the core and the pipes.

The embodiments considered can be used for plasma devices from ten Watts to many kW at an operating frequency from 100 kHz to a few MHZ, and at linear sizes from a few centimeters up to a few meters.

Although the invention has been described in detail in the foregoing embodiments for the purpose of illustration, it is to be understood that such detail is solely for this purpose and that variations can be made therein by those skilled in the art without departing from the spirit and scope of the invention except as it may be described by the following claims.

What is claimed is:

1. An inductive coupling plasma inductor comprising:

an actual primary winding powered directly from a radio frequency source, and a closed ferrite core disposed in said primary winding and positioned relative to a plasma charged discharge chamber for providing a virtual closed secondary winding formed around all surfaces of said ferrite core.

2. An inductive coupling plasma inductor as recited in claim 1 wherein said ferrite core is circular.

3. An inductive coupling plasma inductor as recited in claim 1 wherein said ferrite core is rectangular.

4. An inductive coupling plasma inductor as recited in claim 1 including a metallic cooling jacket enclosing said ferrite core, said jacket having an electrical gap around said core, and having an inlet and an outlet for passing a coolant through said jacket.

5. An inductive coupling plasma inductor as recited in claim 1 wherein said ferrite core is retained in position by said primary winding.

6. An inductive coupling plasma inductor as recited in claims 1, including a plurality of said closed ferrite cores disposed respectively in a plurality of said primary windings and arranged in an assembly for providing a uniform plasma distribution about a required area.

7. An inductive coupling plasma inductor comprising:

an actual primary winding powered directly from a radio frequency source, a closed ferrite core disposed in said primary winding and positioned relative to a plasma charged discharge chamber for providing a virtual closed secondary winding formed in said plasma around said ferrite core, and wherein said ferite core is separated from said discharge chamber by a nonconductive jacket crossing said discharge chamber and wherein only small portions of said ferrite core are exposed out side of said discharge chamber.

* * * * *